(12) United States Patent
Huang et al.

(10) Patent No.: US 12,490,618 B2
(45) Date of Patent: Dec. 2, 2025

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Jinchang Huang, Hubei (CN); Ming Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/247,268

(22) PCT Filed: Feb. 8, 2023

(86) PCT No.: PCT/CN2023/074878
§ 371 (c)(1),
(2) Date: Mar. 29, 2023

(87) PCT Pub. No.: WO2024/077817
PCT Pub. Date: Apr. 18, 2024

(65) Prior Publication Data
US 2024/0365626 A1 Oct. 31, 2024

(30) Foreign Application Priority Data
Oct. 10, 2022 (CN) .......................... 202211236773.0

(51) Int. Cl.
H10K 59/35 (2023.01)
H10K 59/122 (2023.01)
(Continued)

(52) U.S. Cl.
CPC ........ *H10K 59/353* (2023.02); *H10K 59/122* (2023.02); *H10K 59/126* (2023.02); *H10K 59/352* (2023.02); *H10K 59/38* (2023.02); *H10K 59/40* (2023.02)

(58) Field of Classification Search
CPC .... H10K 59/353; H10K 59/35; H10K 59/122; H10K 59/126; H10K 59/352;
(Continued)

(56) References Cited

U.S. PATENT DOCUMENTS

2009/0121983 A1* 5/2009 Sung .................... H10K 59/352
345/76
2025/0037645 A1* 1/2025 Watanabe ................. G09F 9/30
345/82

FOREIGN PATENT DOCUMENTS

CN 111599938 A 8/2020
CN 113257871 A 8/2021
(Continued)

OTHER PUBLICATIONS

International Search Report in International application No. PCT/CN2023/074878, mailed on Jun. 21, 2023.
(Continued)

Primary Examiner — Anne M Hines
Assistant Examiner — Jose M Diaz
(74) Attorney, Agent, or Firm — PV IP PC; Christopher S. Ruprecht; Wei Te Chung

(57) ABSTRACT

The present application provides a display panel including a plurality of pixel units, one of the pixel units includes: a first pixel; and a second pixel spaced from the first pixel. A maximum size of the second pixel in a first direction is greater than a maximum size of the first pixel in the first direction. The second pixel is provided with at least one
(Continued)

pixel notch disconnecting a part of the second pixel to form at least two light emitting portions at least partially spaced apart in the first direction.

16 Claims, 7 Drawing Sheets

(51) Int. Cl.
*H10K 59/126* (2023.01)
*H10K 59/38* (2023.01)
*H10K 59/40* (2023.01)

(58) Field of Classification Search
CPC ...... H10K 59/38; H10K 59/40; H10K 59/131; G09F 9/302; G09F 9/33
See application file for complete search history.

(56) References Cited

FOREIGN PATENT DOCUMENTS

| CN | 113299721 A | 8/2021 |
|---|---|---|
| CN | 115666185 A | 1/2023 |

OTHER PUBLICATIONS

Written Opinion of the International Search Authority in International application No. PCT/CN2023/074878, mailed on Jun. 21, 2023.
Chinese Office Action issued in corresponding Chinese Patent Application No. 202211236773.0 dated Aug. 20, 2025, pp. 1-6.

* cited by examiner

DISPLAY PANEL

TECHNICAL FIELD

The present application relates to the field of display technologies, and especially relates to a display panel.

BACKGROUND

At present, with the development of display technologies, display panels in prior art are developing towards a large viewing angle. However, display panels at the large viewing angle have a problem of color shift at the large viewing angle, which affects users' experiences.

Therefore, it is necessary to propose a technical solution to solve the problem of color shift of the display panels at the large viewing angle.

SUMMARY

Technical Problem

An object of the present application is to provide a display panel to improve a problem of color shift of the display panel at a large viewing angle.

Technical Solution

A display panel including a plurality of pixel units, one of the pixel units comprises:
 a first pixel; and
 a second pixel, wherein the second pixel and the first pixel emit lights with different colors, the second pixel and the first pixel are disposed at intervals, a maximum size of the second pixel in a first direction is greater than a maximum size of the first pixel in the first direction; the second pixel is provided with at least one pixel notch and at least two light emitting portions arranged along the first direction, each of the at least one pixel notch is disposed in at least a part of an area between two adjacent light emitting portions in the first direction.

Beneficial Effects

The display panel is provided by the present application, when the second pixel and the first pixel emit lights with different colors, and the maximum size of the second pixel in the first direction is greater than the maximum size of the first pixel in the first direction, the second pixel is provided with at least one pixel notch and at least two light emitting portions arranged along the first direction, each of the at least one pixel notch is disposed in at least a part of an area between two adjacent light emitting portions in the first direction, so as to reduce an observable angle at which the light emitted by the second pixel deviates from a frontal view angle in the first direction, which is beneficial for the observable angle at which the light emitted by the second pixel deviates from the frontal view angle in the first direction and an observable angle at which the light emitted by the first pixel deviates from the frontal view angle in the first direction to tend to be same, thereby improving the problem of color shift of the display panel in the first direction.

DETAILED DESCRIPTION OF THE EMBODIMENT

The technical solutions in the embodiments of the present application will be clearly and completely described below in conjunction with the drawings in the embodiments of the present application. Obviously, the embodiments described are only a part of the embodiments of the present application, rather than all the embodiments. Based on the embodiments in the present application, all other embodiments obtained by those skilled in the art without creative works should be deemed as falling within the claims of the present application.

Figure 1:
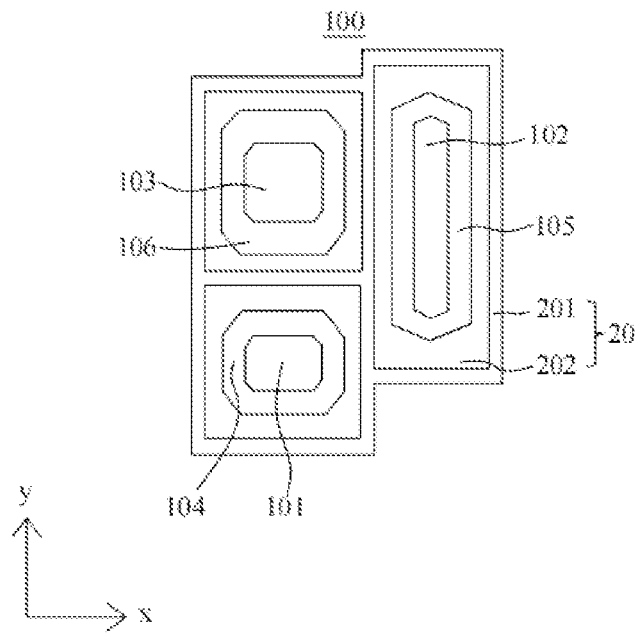
FIG. 1 is a partially enlarged schematic diagram according to a conventional display panel.

Please refer to FIG. 1, FIG. 1 is a partially enlarged schematic diagram according to a conventional display panel. The display panel is an organic light emitting diode display panel. The display panel includes a plurality of first pixel units 100 arranged in an array along a row direction x and a column direction y. The first pixel unit 100 includes a first red pixel 101, a first blue pixel 102 and a first green pixel 103.

The first red pixel 101 is an organic light emitting layer that emits a red light, the first blue pixel 102 is an organic light emitting layer that emits a blue light, and the first green pixel 103 is an organic light emitting layer that emits a green light. A shape of the first red pixel 101 is a chamfered rectangle, a shape of the first blue pixel 102 is an angle-cut rectangle, and a shape of the first green pixel 103 is a chamfered square.

In the first pixel unit 100, the first green pixel 103 and the first red pixel 101 are spaced apart and arranged side by side along the column direction y, and the first blue pixel 102 and the first green pixel 103 are arranged at intervals along the row direction x, that is, the first green pixel 103 and the first red pixel 101 are disposed in a same column, the first blue pixel 102 is disposed in a separate column, and a Real RGB arrangement is adopted to the first pixel unit 100.

In the column direction y, the first green pixel 103 and the first red pixel 101 respectively disposed in two adjacent first pixel units 100 are adjacent and disposed in a same column, and two first blue pixels 102 respectively disposed in two adjacent first pixel units 100 are disposed in a same column.

In the row direction x, the first green pixels 103 and the first red pixels 101 in the same column are disposed alternately with the first blue pixels 102 in the same column.

The display panel further includes a first anode 104, a second anode 105 and a third anode 106. The first red pixel 101 is disposed on the first anode 104, the first blue pixel 102 is disposed on the second anode 105, and the first green pixel 103 is disposed on the third anode 106.

In addition, the first anode 104, the second anode 105, and the third anode 106 are respectively connected to three independent pixel circuits, so that the first red pixel 101, the first blue pixel 102, and the first green pixel 103 are all driven by one pixel circuit.

The display panel further includes a touch layer disposed at a light emitting side of the first pixel unit 100. The touch layer includes metal meshes 20, the metal meshes 20 include a plurality of metal mesh bodies 201 and a plurality of first openings 202, the metal mesh body 201 is disposed at a periphery of the first opening 202.

One metal mesh body 201 is disposed at a periphery of each of the first blue pixels 102. One metal mesh body 201 is disposed at a periphery of each of the first green pixels 103. One metal mesh body 201 is disposed at a periphery of each of the first red pixel 101. Three adjacent first openings 202 respectively overlap with the first red pixel 101, the first blue pixel 102 and the first green pixel 103 of the first pixel unit 100.

In addition, the metal mesh body 201 disposed between the first red pixel 101 and the first green pixel 103 is disposed at a middle position between the first red pixel 101 and the first green pixel 103. The metal mesh body 201 disposed between the first red pixel 101 and the first blue pixel 102 is disposed at a middle position between the first red pixel 101 and the first blue pixel 102. The metal mesh body 201 disposed between the first green pixel 103 and the first blue pixel 102 is disposed at a middle position between the first green pixel 103 and the first blue pixel 102.

The metal mesh bodies 201 have different degrees of shielding effect on the red light emitted by the first red pixel 101, the blue light emitted by the first blue pixel 102, and the green light emitted by the first green pixel 103, resulting in that the display panel appears yellowish when the display panel is observed at some positions that deviates from a frontal view angle in the row direction x, and the display panel appears bluish or cyan when the display panel is observed at some positions that deviates from a frontal view angle in the column direction y. Therefore, the display panel appears a problem of different color shifts in the row direction x and the column direction y at a large viewing angle.

Figure 2:
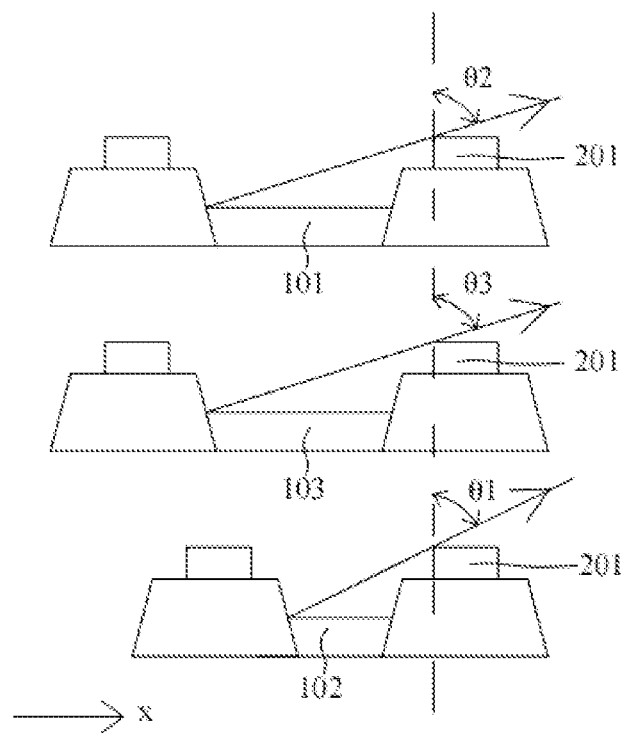
FIG. 2 is a schematic diagram of observing the conventional display panel along a row direction x.

For the problem that the display panel appears different color shifts in the row direction x and the column direction y at the large viewing angle deviating from the frontal view angle, after analysis, the applicant found the reason for the problem of yellowish in the row direction x is that, as shown in FIG. 2, a size of the first red pixel 101 and a size of the first green pixel 103 in the row direction x is greater than a size of the first blue pixel 102 in the row direction x, the size of the first red pixel 101 and the size of the first green pixel 103 in the row direction x are equal, when an observation angle deviating from the frontal viewing angle in the row direction x increases, the observation angle at which the blue light emitted by the first blue pixel 102 is blocked by the metal mesh body 201 is a first observation angle $\theta1$, the observation angle at which the red light emitted by the first red pixel 101 is blocked by the metal mesh body 201 is a second observation angle $\theta2$, the observation angle at which the green light emitted by the first green pixel 103 is blocked by the metal mesh body 201 is a third observation angle $\theta3$, the first observation angle $\theta1$ is less than the second observation angle $\theta2$ and the third observation angle $\theta3$, the second observation angle $\theta2$ is equal to the third observation angle $\theta3$, so that the blue light emitted by the first blue pixel 102 is blocked first and to the largest extent at a position deviating from the frontal viewing angle in the row direction x, due to no blue light or less blue light can be observed at an observation angle between the first observation angle $\theta1$ and the second observation angle $\theta2$, the problem of yellowish appears at the observation angle between the first observation angle $\theta1$ and the second observation angle $\theta2$ after the red light and the green light are mixed.

Figure 3:
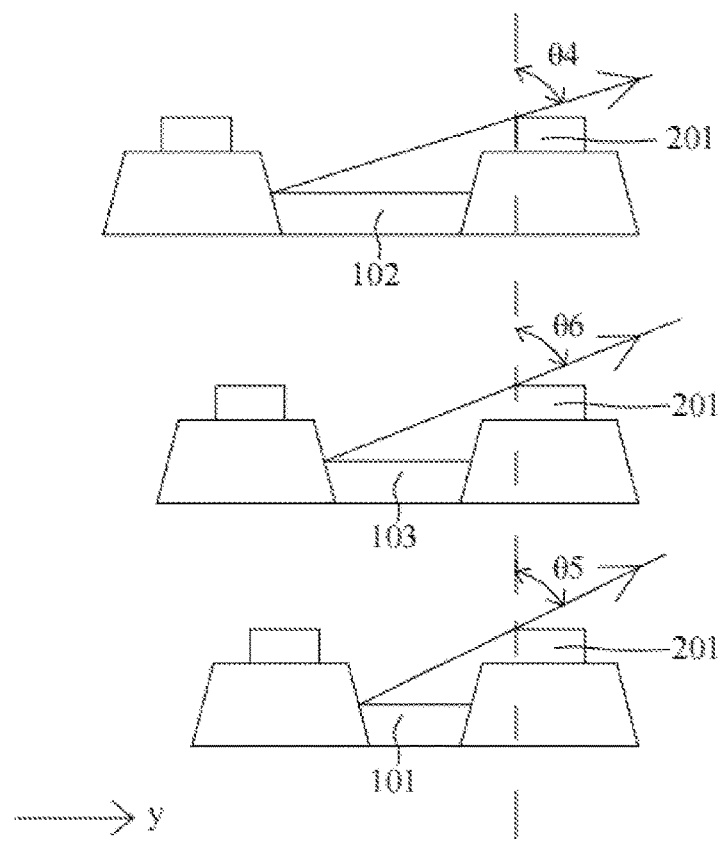
FIG. 3 is a schematic diagram of observing the conventional display panel along a column direction y.

In addition, the reason why the display panel appears bluish or cyan at some viewing angles deviating from the frontal viewing angle in the column direction y is that, as shown in FIG. 3, a size of the first blue pixel 102 in the column direction y is larger than a size of the first green 103 in the column direction y, the size of the first green pixel 103 in the column direction y is larger than a size of the first red pixel 101 in the column direction y, when an observation angle deviating from the frontal viewing angle in the column direction y increases, the observation angle at which the blue light emitted by the blue pixel 102 is blocked by the metal mesh body 201 is a fourth observation angle $\theta4$, the observation angle at which the red light emitted by the first red pixel 101 is blocked by the metal mesh body 201 is a fifth observation angle $\theta5$, the observation angle at which the green light emitted by the first green pixel 103 is blocked by the metal mesh body 201 is a sixth observation angle $\theta6$, the fourth observation angle $\theta4$ is greater than the sixth observation angle $\theta6$, and the sixth observation angle $\theta6$ is greater than the fifth observation angle $\theta5$, so that in the column direction y, the red light emitted by the first red pixel 101 is blocked first, and the fourth observation angle $\theta4$ at which the blue light emitted by the first blue pixel 102 is blocked is the largest, due to an absence of the red light and the green light at an observation angle between the fourth observation angle $\theta4$ and the sixth observation angle $\theta6$, the problem of bluish or cyan appears in the column direction y.

Based on above analysis, the applicant of the present application innovatively proposes that when a second pixel and a first pixel emit light of different colors, and a maximum size of the second pixel in a first direction is larger than a maximum size of the first pixel in the first direction, the second pixel is provided with at least one pixel notch and at least two light emitting portions arranged along the first direction, each of the at least one pixel notch is disposed in at least a part of an area between two adjacent light emitting portions in the first direction, so as to reduce an observable angle at which the light emitted by the second pixel deviates from a frontal view angle in the first direction, which is beneficial for the observable angle at which the light emitted by the second pixel deviates from the frontal view angle in the first direction and an observable angle at which the light emitted by the first pixel deviates from the frontal view angle in the first direction to tend to be same, thereby improving the problem of color shift of the display panel in the first direction.

It should be noted that, in the present application, at least one pixel notch disconnects a part of the second pixel means that at least one pixel notch is disposed at a part of the position of the second pixel, and the second pixel is disconnected at the position where the at least one pixel notch is disposed.

Figure 4:
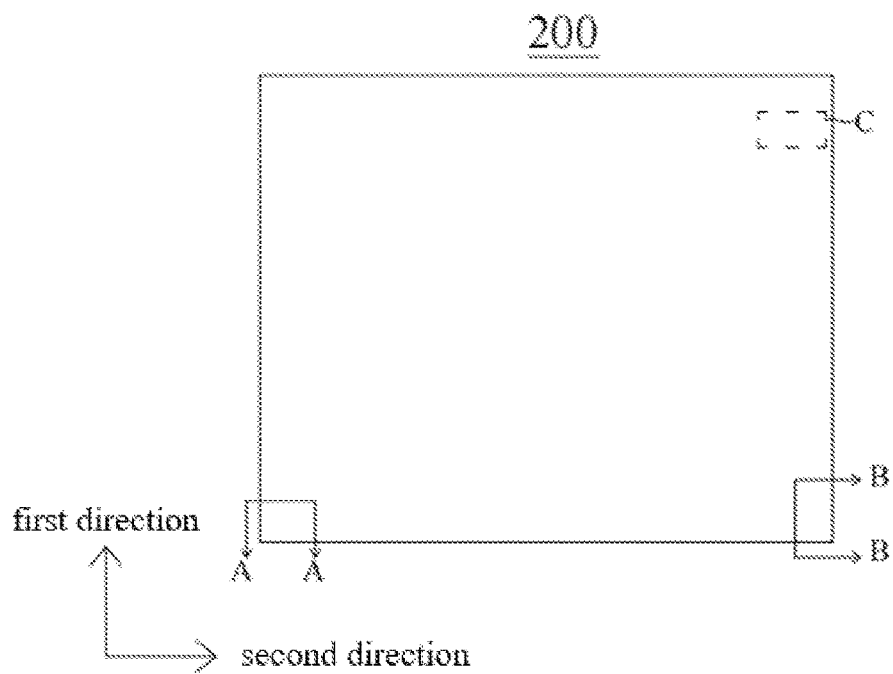
FIG. 4 is a schematic plane diagram of a display panel according to an embodiment of the present application.
Figure 5:
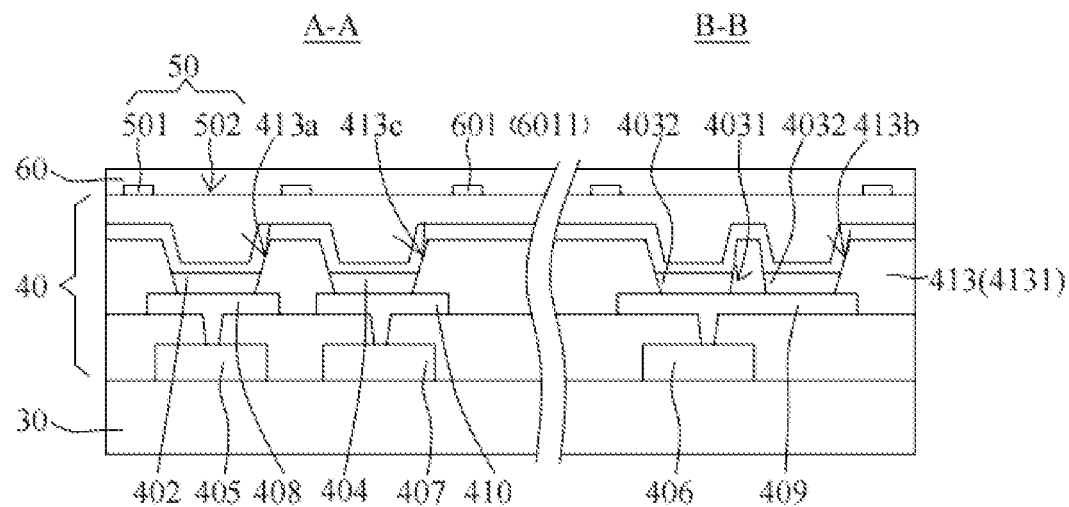
FIG. 5 is a schematic cross-sectional diagram along an A-A tangent line and a B-B tangent line of the display panel shown in FIG. 4.
Figure 6:
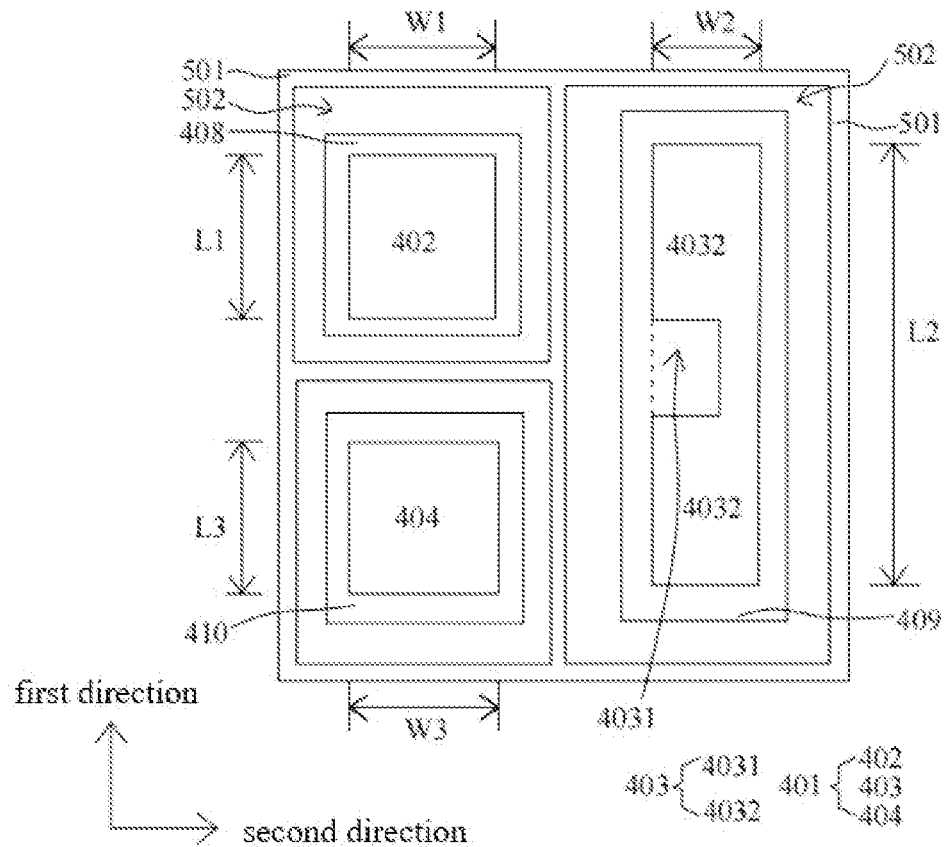
FIG. 6 is a first schematic partial plane diagram at a position C of the display panel shown in FIG. 4.
Figure 7:
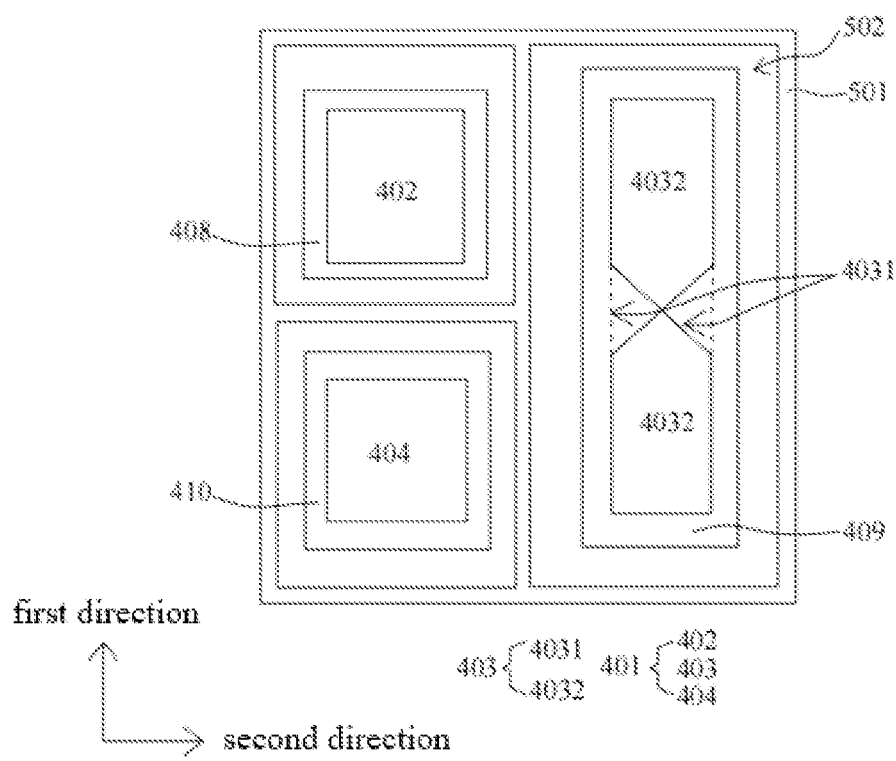
FIG. 7 is a second schematic partial plane diagram at the position C of the display panel shown in FIG. 4.

Please refer to FIG. 4 to FIG. 7, FIG. 4 is a schematic plane diagram of a display panel according to an embodiment of the present application, FIG. 5 is a schematic cross-sectional diagram along an A-A tangent line and a B-B tangent line of the display panel shown in FIG. 4, FIG. 6 is a first schematic partial plane diagram of a position C of the display panel shown in FIG. 4, and FIG. 7 is a second schematic partial plane diagram of the position C of the display panel shown in FIG. 4.

In this embodiment, a display panel 200 is an organic light emitting display panel. The display panel 200 includes a substrate 30, a pixel layer 40 and a light shielding structure 50. The pixel layer 40 is disposed on the substrate 30, and the light shielding structure 50 is disposed at a side of the pixel layer 40 away from the substrate 30.

Wherein, the light shielding structure 50 includes a plurality of light shielding bodies 501 being mesh-shaped and a plurality of second openings 502, and the second opening 502 is disposed in the light-shielding body 501. The light shielding body 501 has a certain thickness and a certain width, and can play a role of light-shielding. The second opening 502 allows light to pass through it.

In this embodiment, the display panel 200 includes at least one of a touch layer and a filter layer. Specifically, the display panel 200 includes a touch layer 60, and the touch layer 60 is disposed at a light emitting side of the pixel layer 40. The touch layer 60 includes touch electrodes 601 disposed in a display area. The touch electrode 601 is a self-capacitive touch electrode or a mutual-capacitive touch electrode. The touch electrodes 601 is composed of metal meshes 6011.

The light shielding structure 50 includes the metal meshes 6011 of the touch electrodes 601. The light shielding body 501 is a metal mesh body of the metal mesh 6011, and the second opening 502 is an opening of the metal mesh 6011.

It can be understood that the display panel 200 may further include a filter layer, the filter layer is disposed at a side of the touch layer 60 away from the pixel layer 40, and the filter layer includes a color filter layer disposed in the display area and a black matrix being mesh-shaped. Therefore, the light shielding structure 50 may further include a black matrix being mesh-shaped in the filter layer.

In this embodiment, the pixel layer 40 includes a plurality of second pixel units 401, the plurality of second pixel units 401 are arranged in an array along the first direction and the second direction. The first direction intersects with the second direction.

Specifically, the first direction is perpendicular to the second direction, but not limited thereto, an angle between the first direction and the second direction may be an acute angle, or the angle between the first direction and the second direction may be an obtuse angle.

The second pixel unit 401 is composed of a first pixel 402, a second pixel 403 and a third pixel 404, and the first pixel 402, the second pixel 403 and the third pixel 404 emit lights of different colors. Light emitting portions of the first pixel 402, the second pixel 403 and the third pixel 404 are all organic light emitting layers.

Specifically, the first pixel 402 is a green pixel that emits a green light, the second pixel 403 is a blue pixel that emits a blue light, and the third pixel 404 is a red pixel that emits a red light.

In the second pixel unit 401, the first pixel 402 and the third pixel 404 are spaced apart along the first direction and disposed side by side, that is, the first pixel 402 and the third pixel 404 are disposed in a same column. The first pixel 402 and the second pixel 403 are spaced apart along the second direction, that is, the second pixel 403 is disposed in a seperate column.

In addition, in the second pixel unit 401, a light emitting area of the second pixel 403 is larger than a light emitting area of the first pixel 402 and a light emitting area of the third pixel 404, so as to increase a lifetime of the second pixel 403.

It should be noted that the light emitting portions of the first pixel 402, the second pixel 403, and the third pixel 404 are all made of small molecular organic light emitting materials. In the case of satisfying high efficiency and process, a lifetime of the small-molecule organic light-emitting material that emits the blue light in the second pixel 403 is the shortest. By increasing the light emitting area of the second pixel 403, a current density of the light emitting portion of the second pixel 403 can be reduced, thereby increasing the lifetime of the second pixel 403.

In the first direction, two second pixels 403 respectively disposed in two adjacent pixel units 401 are disposed side by side, and the first pixel 402 and the third pixel 404 respectively disposed in two adjacent pixel units 401 are adjacent to each other and disposed side by side.

In the second direction, the first pixels 402 and the third pixels 404 disposed side by side in the first direction are disposed alternately with the second pixels 403.

In this embodiment, shapes of the first pixel 402, the second pixel 403 and the third pixel 404 are rectangles or near-rectangles. Wherein, the rectangle includes a square and an oblong. The shape of the near-rectangle tends to be same as the shape of the rectangle. The near-rectangle includes a chamfered rectangle and an angle-cut rectangle. The chamfered rectangle includes a rounded square or a rounded oblong, and the chamfered rectangle includes an oblong or square of which one, two or more right angles are cut off.

Specifically, as shown in FIG. 6 and FIG. 7, the shape of the first pixel 402 is the square, and the shapes of the second pixel 403 and the third pixel 404 are oblongs. Side lengths of the first pixels 402 respectively extend along the first direction and the second direction. A direction of length of the second pixel 403 is parallel to the first direction, and a direction of width of the second pixel 403 is parallel to the second direction. The direction of length of the third pixel 404 is parallel to the second direction, and the direction of width of the third pixel 404 is parallel to the first direction.

It can be understood that, in other embodiments, the shapes of the first pixel 402, the third pixel 404, and the second pixel 403 may also be triangles, circles, ellipses, trapezoids, pentagons, hexagons, octagons or other irregular patterns.

As shown in FIG. 5, in this embodiment, the pixel layer 40 further includes a pixel circuit layer disposed on the substrate 30, and the pixel circuit layer includes a first pixel circuit 405, a second pixel circuit 406 and a third pixel circuit 407.

Wherein, in the display area of the display panel 200, the third pixel circuit 407, the first pixel circuit 405, and the second pixel circuit 406 adjacent to each other are disposed side by side in sequence along the second direction and form a circuit repeating unit. The circuit repeating units are arranged in an array along the first direction and the second direction.

The first pixel circuit 405 is electrically connected to the first pixel 402 in a one-to-one correspondence, so that the first pixel circuit 405 drives the first pixel 402 to emit light. The second pixel circuit 406 is electrically connected to the second pixel 403 in a one-to-one correspondence, so that the second pixel circuit 406 drives the second pixel 403 to emit light. The third pixel circuit 407 is electrically connected to the third pixel 404 in a one-to-one correspondence, so that the third pixel circuit 407 drives the third pixel 404 to emit light.

It should be noted that, the first pixel circuit 405, the second pixel circuit 406 and the third pixel circuit 407 are same, and are all selected from any one of a 2T1C circuit, a 3T1C circuit, a 4T1C circuit, a 5T1C circuit, a 6T1C circuit and a 7T1C circuit, but not limited to thereto.

In this embodiment, the pixel layer 40 further includes a first anode 408, a second anode 409, and a third anode 410 disposed on the pixel circuit layer, and the first anode 408, the second anode 409, and the third anode 410 are disposed in a same layer. The first anode 408, the second anode 409 and the third anode 410 are integral reflective electrodes.

Wherein, the first anode 408 is electrically connected to the first pixel circuit 405, the second anode 409 is electrically connected to the second pixel circuit 406, and the third anode 410 is electrically connected to the third pixel circuit 407.

In this embodiment, the pixel layer 40 further includes a pixel definition layer 413, and the pixel definition layer 413 is disposed on the pixel circuit layer. The pixel definition layer 413 includes a dam 4131, a first pixel definition opening 413a, a second pixel definition opening 413b and a third pixel definition opening 413c, The dam is disposed at peripheries of the first pixel definition opening 413a, the second pixel definition opening 413b and the third pixel definition opening 413c. The dam 4131 covers edges of the first anode 408, the second anode 409 and the third anode 410.

Wherein, the first pixel definition opening 413a overlaps with the first anode 408 and exposes a part of the first anode 408, and the light emitting portion of the first pixel 402 is disposed on the first anode 408 in the first pixel definition opening 413a, so that the first pixel 402 is electrically connected to the first pixel circuit 405 in a one-to-one correspondence. An orthographic projection of the light emitting portion of the first pixel 402 on the substrate 30 is within an orthographic projection of the first anode 408 on the substrate 30.

The second pixel definition opening 413b overlaps with the second anode 409 and exposes a part of the second anode 409, and the light emitting portion of the second pixel 403 is disposed on the second anode 409 in the second pixel definition opening 413b, so that the second pixel 403 is electrically connected to the second pixel circuit 406. An orthographic projection of the light emitting portion of the second pixel 403 on the substrate 30 is within an orthographic projection of the second anode 409 on the substrate 30.

The third pixel defining opening 413c overlaps with the third anode 410 and exposes a part of the third anode 410, the light emitting portion of the third pixel 404 is disposed on the third anode 410 in the third pixel defining opening 413c, so that the third pixel 404 is electrically connected to the third pixel circuit 407. An orthographic projection of the light emitting portion of the third pixel 404 on the substrate 30 is within an orthographic projection of the third anode 410 on the substrate 30.

In this embodiment, a corresponding one of light shielding bodies 501 is disposed at a periphery of the first pixel 402, and the first pixel 402 overlaps with a corresponding one of the second opening 502. A corresponding one of light shielding bodies 501 is disposed at a periphery of the second pixel 403, and the second pixel 403 overlaps with a corresponding one of the second opening 502. a corresponding one of light shielding bodies 501 is disposed at a periphery of the third pixel 404, and the third pixel 404 overlaps with a corresponding one of the second opening 502. The light shielding bodies 501 have a certain shielding effect on lights obliquely emitted by the first pixel 402, the second pixel 403 and the third pixel 404 respectively.

Wherein, there is a common part between the light shielding body 501 disposed at the periphery of the first pixel 402 and the light shielding body 501 disposed at the periphery of the second pixel 403. There is a common part between the light shielding body 501 disposed at the periphery of the first pixel 402 and the light shielding body 501 disposed at the periphery of the third pixel 404. There is a common part between the light-shielding body 501 disposed at the periphery of the second pixel 403 and the light-shielding body 501 disposed at the periphery of the third pixel 404.

It should be noted that, in other embodiments, the light shielding body 501 may be disposed at a periphery of two adjacent second pixels 403 in the first direction except that the light shielding body 501 is disposed at the periphery of the second pixel 403 as shown in FIG. 6 and FIG. 7.

In this embodiment, a maximum size of the first pixel 402 in the first direction is L1, and a maximum size of the first pixel 402 in the second direction is W1. When the shape of the first pixel 402 is the square, two adjacent side lengths of the first pixel 402 being square are respectively parallel to the first direction and the second direction, and both L1 and W1 are equal to a side length of the first pixel 402 being square.

A maximum size of the second pixel 403 in the first direction is L2, and a maximum size of the second pixel 403 in the second direction is W2. When the shape of the second pixel 403 is the oblong, a direction of a length of the second pixel 403 being oblong is parallel to the first direction and a direction of a width of the second pixel 403 being oblong is parallel to the second direction. L2 is equal to the length of the second pixel 403 being oblong, W2 is equal to the width of the second pixel 403 being oblong, and the length of the second pixel 403 being oblong is greater than the width of the second pixel 403 being oblong.

A maximum size of the third pixel 404 in the first direction is L3, and a maximum size of the third pixel 404 in the second direction is W3. When a shape of the third pixel 404 is the oblong, a direction of a length of the third pixel 404 of being oblong is parallel to the first direction and a direction of width of the third pixel 404 being oblong is parallel to the second direction. L3 is equal to the width of the third pixel 404 being oblong, W3 is equal to the length of the third pixel 404 being oblong, and the width of the third pixel 404 being oblong is less than the length of the third pixel 404 being oblong.

In this embodiment, the maximum size L2 of the second pixel 403 in the first direction is greater than the maximum size L1 of the first pixel 402 in the first direction, so that the maximum size of the second pixel 403 in the first direction is sufficiently large, which is beneficial for the light emitting area of the second pixel 403 to be sufficiently large, thereby improving the lifetime of the second pixel 403.

Further, a ratio of the maximum size L2 of the second pixel 403 in the first direction to the maximum size L1 of the first pixel 402 in the first direction is greater than or equal to 1.2 and less than or equal to 4, so that the maximum size of the second pixel 403 in the first direction is sufficiently enough, which is beneficial for the light emitting area of the second pixel 403 to be sufficiently enough, thereby improving the lifetime of the second pixel 403, and improving the problem of bluish caused by too large difference between the maximum size of the second pixel 403 and the first pixel 402 in the first direction.

It can be understood that, the ratio of the maximum size L2 of the second pixel 403 in the first direction to the maximum size L1 of the first pixel 402 in the first direction may be greater than or equal to 1.5 and less than or equal to 3.5, or, the ratio of the maximum size L2 of the second pixel 403 in the first direction to the maximum size L1 of the first pixel 402 in the first direction may be greater than or equal to 1.8 and less than or equal to 3, or, the ratio of the maximum size L2 of the second pixel 403 in the first direction to the maximum size L1 of the first pixel 402 in the first direction may be greater than or equal to 2 and less than or equal to 2.8.

For example, the ratio of the minimum size L2 of the second pixel 403 in the first direction to the maximum size L1 of the first pixel 402 in the first direction is 1.2, 1.5, 1.8, 2, 2.2, 2.5, 2.8, 3, 3.2, 3.4, 3.6, 3.8, or 4.0.

In this embodiment, a minimum size of the second pixel 403 in the first direction is greater than the maximum size L1 of the first pixel 402 in the first direction. Due to the shape of the second pixel 403 is the oblong, the minimum size of the second pixel 403 in the first direction is equal to the maximum size L2 of the second pixel 403 in the first direction.

It can be understood that, in other embodiments, the minimum size of the second pixel 403 in the first direction may also be less than or equal to the maximum size L1 of the first pixel 402 in the first direction. In addition, when the shape of the second pixel 403 is other shapes, the minimum size of the second pixel 403 in the first direction may also be less than the maximum size L2 of the second pixel 403 in the first direction.

In this embodiment, L2 is greater than L3, and L1 is greater than or equal to L3. W1 is equal to W3, and W1 is greater than W2.

It should be noted that the maximum size L1 of the first pixel 402 in the first direction is equal to a maximum distance between two points of which connection line is parallel to the first direction at the edge of the first pixel 402, the maximum size W1 of the first pixel 402 is in the second direction is equal to a maximum distance between two points of which connection line is parallel to the second direction at the edge of the first pixel 402. The maximum size of the second pixel 403 in the first direction and the second direction and the maximum size of the third pixel 404 in the first direction and the second direction can be deduced by analogy, which is not repeated here.

In this embodiment, the second pixel 403 includes at least one blue pixel notch 4031 and at least two blue light emitting portions 4032 at least partially spaced apart in the first direction.

Specifically, as shown in FIG. 6 and FIG. 7, the at least one blue pixel notch 4031 disconnects a part of the second pixel 403 to form at least two blue light emitting portions 4032 partially spaced apart and connected to each other in the first direction. Wherein, the second pixel 403 is disconnected at a position in which at least one blue pixel gap 4031 is defined.

As shown in FIG. 6, the blue pixel notch 4031 being rectangular is disposed along an edge of the second pixel 403 being oblong extending in the first direction, and the blue pixel notch 4031 disconnects a part of the second pixel 403 to form two blue light emitting portions 4032 partially spaced apart in the first direction, and the two blue light emitting portions 4032 are connected in the first direction. A part of the second pixel 403 except for the blue pixel notch 4031 is integrated and can emit the blue light, the part of the second pixel 403 except for the blue pixel notch 4031 is disposed in the second pixel definition opening 413b. A shape of an outer contour of the second pixel definition opening 413b and a shape of an outer contour of the part of the second pixel 403 except for the blue pixel notch 4031 are same.

As shown in FIG. 7, two blue pixel notches 4031 symmetrically disposed in the second direction are respectively disposed along two edges of the second pixel 403 being oblong extending in the first direction, and shapes of the blue pixel notches 4031 are triangle. The two blue pixel notches 4031 disconnect a part of the second pixel 403 to form the two blue light emitting portions 4032 partially spaced apart in the first direction, and the two blue light emitting portions 4032 are connected to each in the first direction and emit light as a whole.

It can be understood that, in addition to it that the second pixel 403 includes one or two blue pixel notches 4031 shown in FIG. 6 and FIG. 7, a number of the blue pixel notch 4031 may be more than two. When the number of the blue pixel notch 4031 may be more than two, at least a part of more than two blue pixel notches 4031 may be arranged along the first direction, and/or at least a part of the more than blue pixel notches 4031 may be arranged in the second direction.

As shown in FIG. 5, the two blue light emitting portions 4032 in FIG. 6 and FIG. 7 are both disposed in the second pixel definition opening 413b, and the dam 4131 is disposed at a position of the blue pixel notch 4031, so that the two blue light emitting portions 4032 are disposed spaced apart in the first direction, and no organic light emitting layer emitting the blue light is formed at the blue pixel notch 4031.

In this embodiment, the shape of the blue pixel notch 4031 includes but is not limited to a rectangle, a semicircle, a trapezoid, a triangle and an irregular shape.

In this embodiment, an area of anyone of the blue pixel notch 4031 is S1, a sum of an area of the at least one blue pixel notch 4031 is S2, and an area of the second pixel 403 except for the at least one blue pixel notch 4031 is S3, $0<S1/(S2+S3)\leq0.2$. For example, $S1/(S2+S3)$ is 0.05, 0.08, 0.1, 0.12, 0.14, 0.15 or 0.2.

Figure 8:
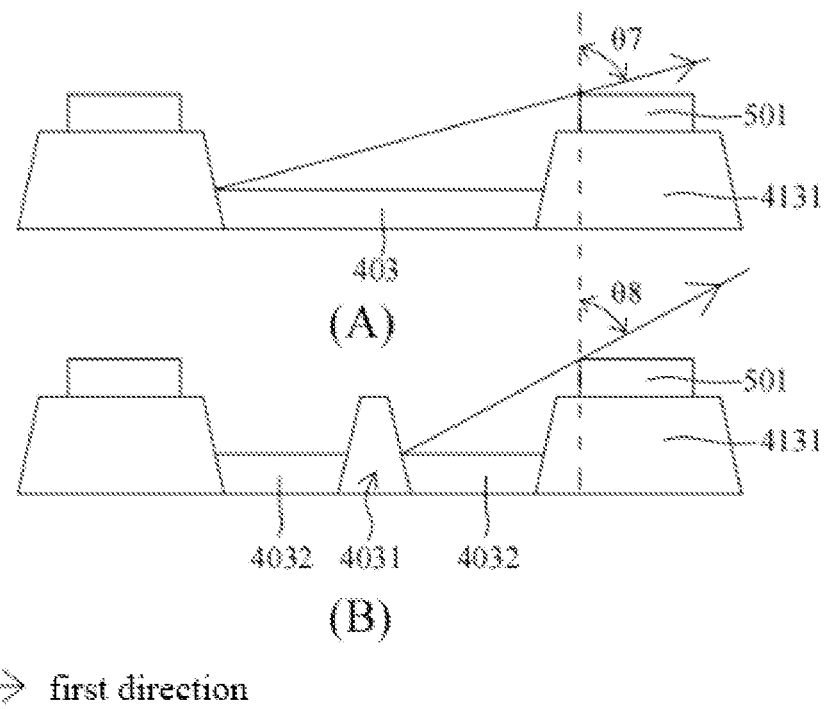
FIG. 8 is a schematic diagram of observing a display panel along the first direction when the second pixel of the display panel is not provided with a blue pixel notch and is provided with the blue pixel notch.

As shown in (A) of FIG. 8, if the second pixel 403 is not provided with the blue pixel notch 4031, an observation angle at which the blue light emitted by the second pixel 403 in the first direction is blocked by the light shielding body 501 is a seventh observation angle $\theta7$, due to L2 is greater than L1 and L3, so that the seventh observation angle $\theta7$ is greater than observation angles of the first pixel 402 and the third pixel 404 in the first direction, and the display panel appears bluish in the first direction.

As shown in (B) of FIG. 8, if the second pixel 403 is provided with one or two blue pixel notches 4031 as shown in FIG. 6 or FIG. 7, the second pixel 403 is disconnected into two blue light emitting portions 4032 that are partially spaced apart and connected in the first direction by one or two blue pixel notches 4031, an observation angle at which the blue light emitted by one of the blue light emitting portions 4032 is blocked by the light shielding body 501 is a eighth observation angle θ8, the eighth observation angle θ8 is less than the seventh observation angle θ7, and a part of the blue light emitted by the other one of the light emitting portions 4032 is blocked by the dam 4131 at the blue pixel notch 4031, so that an observation angle at which the blue light emitted by the part of the second pixel 403 except for the blue pixel notch 4031 as a whole is blocked is reduced, which is beneficial for the observable angle at which the blue light emitted by the second pixel deviates from the frontal view angle in the first direction and observable angles of the green light emitted by the first pixel 402 and the red light emitted by the third pixel 404 deviate from the frontal view angle tend to be same, thereby improving the problem that the display panel appears bluish at an angle deviating from the frontal view angle in the first direction.

In the embodiment of the present application, when the first pixel, the second pixel, and the third pixel respectively emit lights of different colors, and the maximum size of the second pixel in the first direction is larger than that of the first pixel and the third pixel in the first direction, the second pixel is provided with at least one blue pixel notch and at least two blue light emitting portions partially spaced apart in the first direction, so as to reduce the observable angle at which the light emitted by the second pixel deviates from the frontal view angle in the first direction, which is beneficial for the observable angle at which the blue light emitted by the second pixel deviates from the frontal view angle in the first direction and the observable angles at which the green light emitted by the first pixel and the red light emitted by the third pixel deviate from the frontal view angle of in the first direction to tend to be same, thereby improving the problem that the display panel appears bluish at an angle deviating from the frontal view angle in the first direction.

Figure 9:
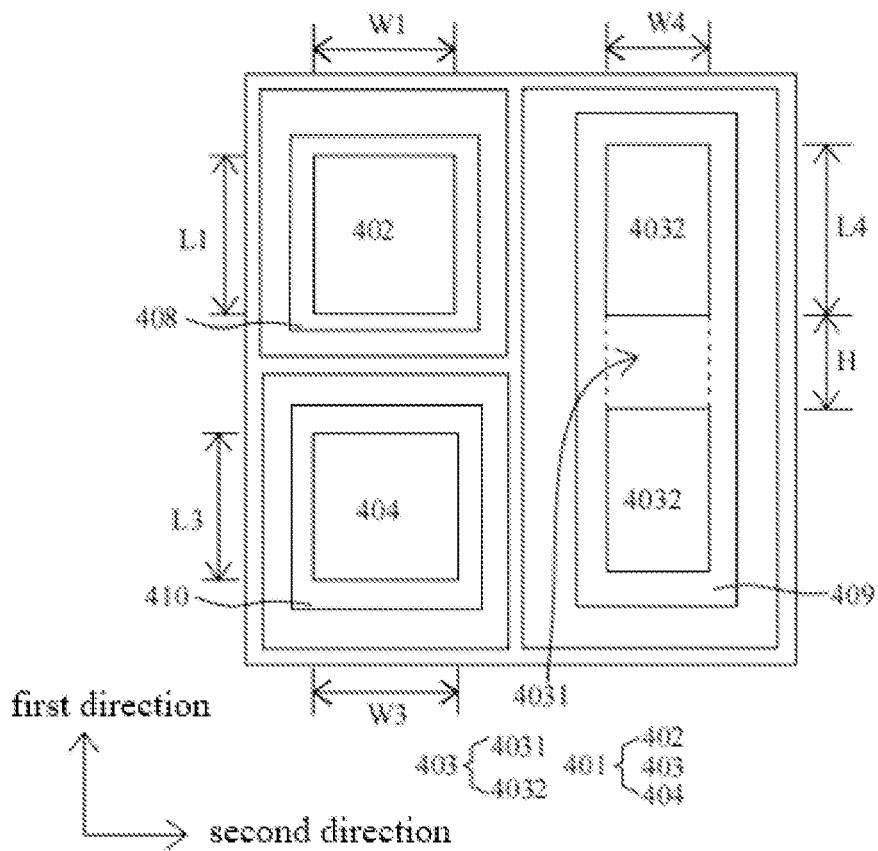
FIG. 9 is a schematic partial plane diagram of a display panel according to another embodiment of the present application.

Please refer to FIG. 9, which is a schematic partial plane diagram of a display panel according to another embodiment of the present application. A display panel corresponding to FIG. 9 is basically similar to the display panel shown in FIG. 6, similarities is not repeated, and differences include that, at least two adjacent blue light emitting portions 4032 are completely spaced apart by a blue pixel notch 4031 in the first direction, in other words, there is no connection between the at least two adjacent blue light emitting portions 4032.

Specifically, the second pixel 403 includes two blue light emitting portions 4032 and one blue pixel notch 4031 therebetween in the first direction.

It should be noted that the dam 4131 is disposed at a position of the one blue pixel notch 4031, and the two blue light emitting portions 4032 spaced apart are respectively disposed in two second pixel definition opening 413b spaced apart. The dam 4131 between the two second pixel definition openings 413b makes the two blue light emitting portions 4032 to be completely spaced apart from each other.

It can be understood that a number of the blue pixel notch 4031 may also be two or more, and each of the blue pixel notch 4031 is disposed between two adjacent blue light emitting portions 4032 that are completely spaced apart in the first direction.

It should also be noted that when a size of the second pixel unit 401 is constant, the larger the number of the blue pixel notch 4031, the smaller an area of the light emitting portion of the second pixel 403 except for the blue pixel notch 4031, and the shorter a lifetime of the second pixel 403.

In this embodiment, a shape of each of the blue light emitting portion 4032 is a rectangle or near-rectangle. Specifically, the shape of each of the blue light emitting portion 4032 is the rectangle, and two adjacent side lengths of the blue light emitting portion 4032 being rectangular are respectively parallel to the first direction and the second direction.

It can be understood that the shape of each of the blue light emitting portions 4032 may also be a semicircle, a semiellipse or an irregular figure.

In this embodiment, the two blue light emitting portions 4032 are same, and the two blue light emitting portions 4032 are disposed side by side and symmetrically in the first direction. In other words, the shapes of the two blue light emitting portions 4032 and sizes of the two blue light emitting portions 4032 in the first direction and the second direction are same, which is beneficial for the display effect on the opposite sides of the display panel 200 that deviate from the front viewing angle in the first direction to tend to be same.

It can be understood that the two blue light emitting portions 4032 may also be different, for example, the two blue light emitting portions 4032 have a same shape, but the two blue light emitting portions 4032 have different sizes in the first direction and the second direction.

In this embodiment, a ratio of a maximum distance H between the two blue light emitting portions 4032 in the first direction to a maximum size L4 of the blue light emitting portion 4032 in the first direction is greater than or equal to 0.2 and less than or equal to 1, so as to improve a problem that the display panel 200 appears bluish in the first direction.

Further, a ratio of a maximum distance H between the two blue light emitting portions 4032 in the first direction to a maximum size L4 of the blue light emitting portion 4032 in the first direction is greater than or equal to 0.4 and less than or equal to 0.8, so as to further improve the problem that the display panel 200 appears bluish in the first direction, and prevent the maximum distance H between the two blue light emitting portions 4032 in the first direction from too large, thus ensuring the lifetime of the second pixel, that is, the lifetime of the second pixel 403 and the problem that the display panel 200 appears bluish in the first direction is balanced.

For example, the ratio of the maximum distance H between the two blue light emitting portions 4032 in the first direction to the maximum size L4 of the blue light emitting portion 4032 in the first direction may be 0.2, 0.3, 0.4, 0.5, 0.6, 0.7, 0.8, 0.9, 0.95 or 1.

It should be noted that, in this embodiment, the maximum distance H between the two blue light emitting portions 4032 in the first direction is a maximum size of the blue pixel notch 4031 in the first direction. In addition, a maximum size of the second pixel 403 in the first direction is equal to a sum of a maximum size of the blue pixel notch 4031 in the first direction and a sum of maximum sizes of the two blue light emitting portions 4032 in the first direction.

In this embodiment, a shape of the first pixel 402 is a rectangle, and two adjacent side lengths of the first pixel 402 being rectangular are respectively parallel to the first direction and the second direction. A ratio of a maximum size W1 of the first pixel 402 in the second direction to a maximum size L1 of the first pixel 402 in the first direction is a first ratio. Wherein, the first ratio is greater than or equal to 0.6 and less than or equal to 1, that is, the maximum size L1 of the first pixel 402 in the first direction is greater than or equal to the maximum size W1 of the first pixel 402 in the second direction.

A ratio of a maximum size W4 of each of the blue light emitting portion 4032 in the second direction to a maximum size L4 of each of the blue light emitting portion 4032 in the first direction is a second ratio. The second ratio is greater than or equal to 0.2 and less than or equal to 1, so as to the maximum size W4 of each of the blue light emitting portion 4032 in the second direction is less than or equal to the maximum size L4 of each of the blue light emitting portion 4032 in the first direction.

A shape of the third pixel 404 is a rectangle, and two adjacent side lengths of the third pixel 404 being rectangular are respectively parallel to the first direction and the second direction. A ratio of a maximum size W3 of the third pixel 404 in the second direction to a maximum size L3 of the third pixel 404 in the first direction is a third ratio. The third ratio is greater than 1 and less than or equal to 1.2. The maximum size W3 of the third pixel 404 in the second direction is equal to the maximum dimension W1 of the first pixel 402 in the second direction.

Wherein, a ratio of the first ratio to the second ratio is greater than or equal to 1 and less than or equal to 1.8, so that the ratio of the maximum size W4 of each of the blue light emitting portion 4032 in the second direction to the maximum size L4 in the first direction is less than or equal to the ratio of the maximum size W1 of the first pixel 402 in the second direction to the maximum size L1 in the first direction, which is beneficial for the shape of each of the blue light emitting portion 4032 and the shape of the first pixel 402 to tend to be same or the shape of the blue light emitting portion 4032 is narrower and longer than the shape of the first pixel 402, so as to ensure the lifetime of the second pixel 403 when the blue pixel notch 4031 is added to improve the problem that the display panel appears bluish in the first direction.

For example, the ratio of the first ratio to the second ratio may be 1.0, 1.1, 1.2, 1.3, 1.4, 1.6 or 1.8.

In addition, when the maximum size W3 of the third pixel 404 in the second direction is equal to the maximum size W1 of the first pixel 402 in the second direction, a ratio of the first ratio to the third ratio is greater than or equal to 0.6 and less than or equal to 1, so that an area of the first pixel 402 is greater than or equal to an area of the third pixel 404, so as to improve a lifetime of the first pixel 402, and the problem of color shift caused by large difference of size between the first pixel 402 and the third pixel 404 in the first direction is prevented.

For example, the ratio of the first ratio to the third ratio may be 0.6, 0.7, 0.8, 0.9 or 1.

It should be noted that, due to a lifetime of an organic material emitting a green light is shorter than that a lifetime of an organic material emitting a red light, an increase of the area of the first pixel 402 is beneficial to increase the lifetime of the first pixel 402.

In this embodiment, the at least two blue light emitting portions 4032 of the second pixel 403 are disposed on a second anode 409, that is, the at least two blue light emitting portions 4032 share the second anode 409. Specifically, the two blue light emitting portions 4032 are both disposed on the second anode 409.

The two blue light emitting portions of the second pixel of the display panel in the embodiment of the present application are completely spaced apart in the first direction by one blue pixel notch, so as to reduce an observable angle of the blue light emitted by the second pixel deviates from the frontal viewing angle in the first direction, which is beneficial for the observable angle at which the blue light emitted by the second pixel deviates from the frontal viewing angle in the first direction and observable angles at which the green light emitted by the first pixel and the red light emitted by the third pixel deviates from the frontal viewing angle in the first direction to tend to be same, thereby improving the problem that the display panel appears bluish in the first direction, and ensuring that a sum of areas of the two blue light emitting portions is large enough, which prevents too many blue pixel notches that cause areas of the blue light emitting portions to be too small to shorten the lifetime of the second pixel.

Figure 10:
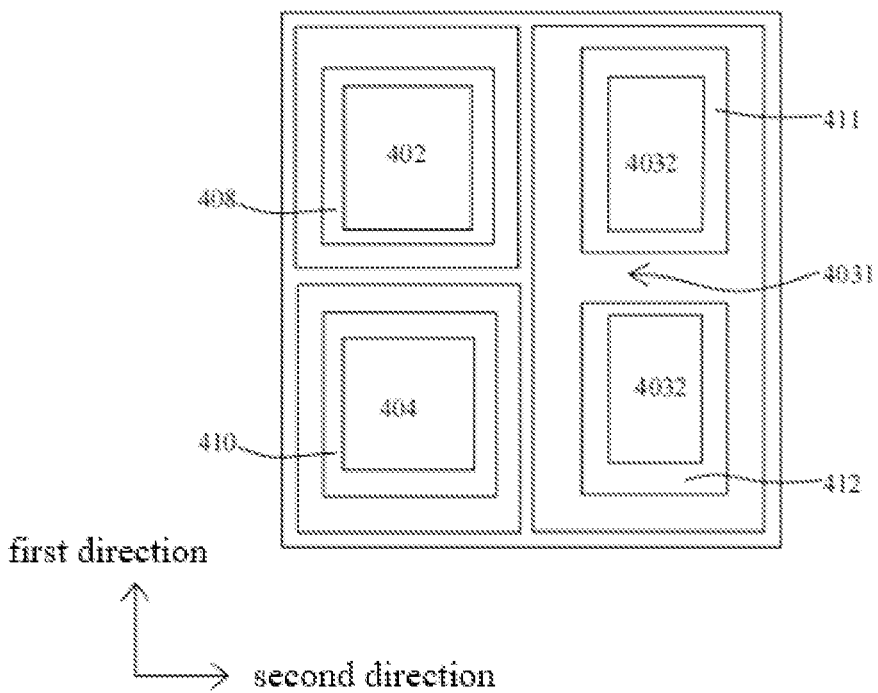
FIG. 10 is a partially enlarged schematic diagram of a display panel according to still another embodiment of the present application.
Figure 11:
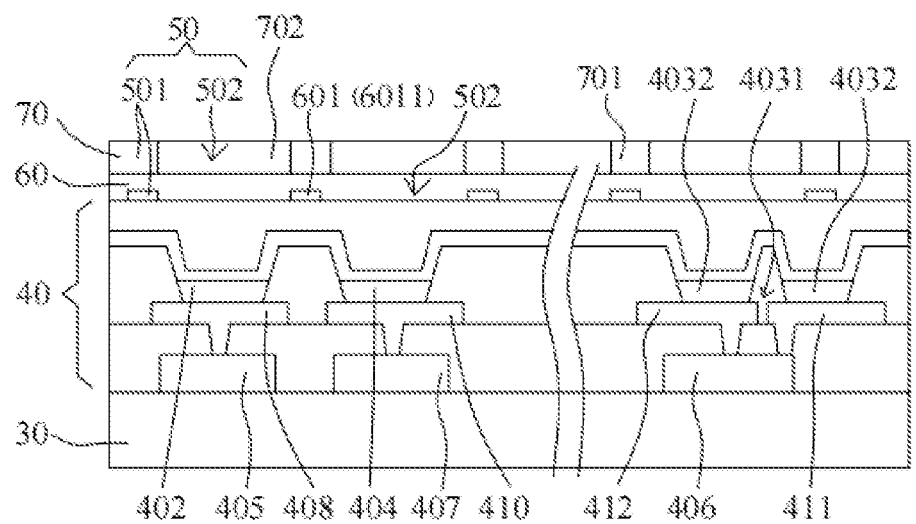
FIG. 11 is a schematic cross-sectional diagram of a display panel according to still another embodiment of the present application.

Please refer to FIG. 10 and FIG. 11, FIG. 10 a partially enlarged schematic diagram of a display panel according to still another embodiment of the present application, and FIG. 11 is a schematic cross-sectional diagram of a display panel according to still another embodiment of the present application.

A display panel of the embodiment of the present application is basically similar to the display panel corresponding to FIG. 9, similarities is not repeated, and differences include that a display panel 200 of this embodiment of the present application further includes a filter layer 70, the filter layer 70 is disposed at a side of the touch layer 60 away from the substrate 30, the filter layer 70 includes a black matrix 701 being mesh-shaped and a color film layer 702. The color film layer 702 includes a first photoresist corresponding to the light emitting portion of the first pixel 402, a second photoresist corresponding to the light emitting portion of the second pixel, and a third photoresist corresponding to the light emitting portion of the third pixel 404. A color of the first photoresist is the same as a color of the light emitted by the first pixel 402, a color of the second photoresist is same as a color of a light emitted by the second pixel 403, and a color of the third photoresist is the same as a color of a light emitted by the third pixel 404. A light shielding structure 50 includes a black matrix 701 being mesh-shaped.

Moreover, the differences between the display panel of the embodiment of the present application and the display panel corresponding to FIG. 9 further includes, in this embodiment, the at least two blue light emitting portion 4032 is disposed on at least two anodes being disconnected in a one-to-one correspondence, that is, the blue light emitting portion 4032 is disposed on the anode being independent. The at least two anodes being disconnected are electrically connected to a same second pixel circuit 406.

Specifically, as shown in FIG. 10 and FIG. 11, the display panel 200 includes a fourth anode 411 and a fifth anode 412 being disconnected, and the two blue light emitting portions 4032 are respectively disposed on the fourth anode 411 and the fifth anode 412, and the fourth anode 411 and the fifth anode 412 are both electrically connected to the same second pixel circuit 406.

The two blue light emitting portions of the second pixel of the display panel in the embodiment of the present application are completely spaced apart in the first direction by the blue pixel notch, so as to improve the problem that the display panel appears bluish in the first direction, and prevent too many pixel notches from leading too small areas of the blue light emitting portion 4032 that reduces the lifetime of a second pixel. Moreover, the at least two blue light emitting portions of the second pixel are disposed on at least two anodes being disconnected in a one-to-one correspondence, so as to reduce areas of the anodes below the two blue light emitting portions, thus reducing a reflectivity of ambient light incident on the display panel after passing through the filter layer, and thereby improving the display effect of the display panel.

Figure 12:
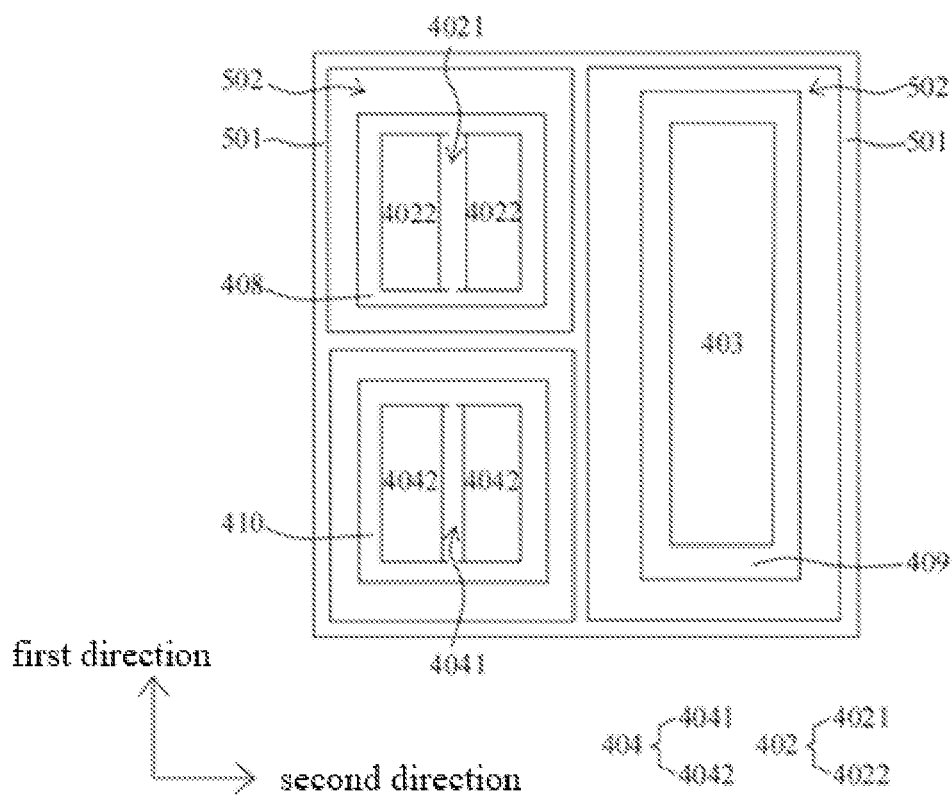
FIG. 12 is a partially enlarged schematic diagram of a display panel according to still another embodiment of the present application.

Please refer to FIG. 12, FIG. 12 is a partially enlarged schematic diagram of a display panel according to still another embodiment of the present application. A display panel of this embodiment is basically similar to the display panel corresponding to FIG. 9, similarities is not repeated, and differences include that the second pixel 403 is not provided with the blue pixel notch 4031, the first pixel 402 is provided with at least one green pixel notch 4021 and at least two green light emitting portions 4022 arranged along the second direction, the third pixel 404 is provided with at least one red pixel notch 4041 and at least two red light emitting portions 4042 arranged along the second direction, each of the at least one green pixel notch 4021 is disposed in at least a part of an area between two adjacent green light emitting portions 4022 in the second direction, each of the at least one red pixel notch 4041 is disposed in at least a part of an area between two adjacent red light emitting portions 4042 in the second direction.

Specifically, the first pixel 402 includes one green pixel notch 4021 and two green light emitting parts 4022, and the one green pixel notch 4021 is disposed between the two green light emitting portions 4022 in the second direction and makes the two green light emitting portions 4022 to be spaced apart. The one green pixel notch 4021 is oblong, and the two green light emitting portions 4022 are disposed symmetrically with respect to the one green pixel gap 4021 in the second direction. The third pixel 404 includes one red pixel notch 4041 and two red light emitting portions 4042, and the one red pixel notch 4041 is disposed between the two red light emitting portions 4042 in the second direction and makes the two red light emitting portions 4042 to be spaced apart. The red pixel notch 4041 is oblong, the two red light emitting portions 4042 are disposed symmetrically with respect to the one red pixel notch 4041 in the second direction, the one red pixel notch 4041 and the one green pixel gap 4021 are arranged side by side in the first direction. The second pixel 403 is a blue light emitting portion being oblong.

In this embodiment, A dam 4131 is disposed at positions of the at least one green pixel notch 4021 and the at least one red pixel notch 4041, the two green light emitting portions 4022 are disposed at intervals by the dam 4131, and the two red light emitting portions 4042 are also disposed at intervals by the dam 4131. Moreover, the two green light emitting portions 4022 are respectively disposed in two first pixel definition openings 413a disposed at intervals and are disposed on a first anode 408. The two red light emitting portions 4042 are respectively disposed in two third pixel definition openings 413c disposed at intervals and disposed on a third anode 410.

It can be understood that the first pixel may include the at least one green pixel notch and at least two green light emitting portions partially spaced apart in the second direction, and the third pixel may include the at least one red pixel and at least two red light emitting portions partially spaced apart in the second direction. In addition, the red pixel notch 4041 and the green pixel notch 4021 may also be staggered.

In the embodiment of the present application, when the second pixel, the first pixel, and the third pixel respectively emit lights of different colors, and maximum sizes of the third pixel and the first pixel in the second direction is larger than a maximum size of the second pixel in the second direction, the first pixel is provided with the at least one green pixel notch and the at least two green light emitting portions arranged along the second direction, and the third pixel is provided with at least one red pixel notch and the at least two red light emitting portions arranged along second direction, each of the at least one green pixel notch is disposed in at least a part of an area between two adjacent green light emitting portions in the second direction, each of the at least one red pixel notch is disposed in at least a part of an area between two adjacent red light emitting portions in the second direction, so as to reduce observable angles at which the green light emitted by first pixel and the red light emitted by the third pixel deviate from the frontal viewing angle in the second direction, which is beneficial for the observable angles at which the green light emitted by first pixel and the red light emitted by the third pixel deviate from the frontal viewing angle in the second direction and an observable angle at which the blue light emitted by the second pixel deviates from the frontal viewing angle in the second direction to tend to be same, thereby improving a problem that the display panel appears yellowish in the second direction.

Figure 13:
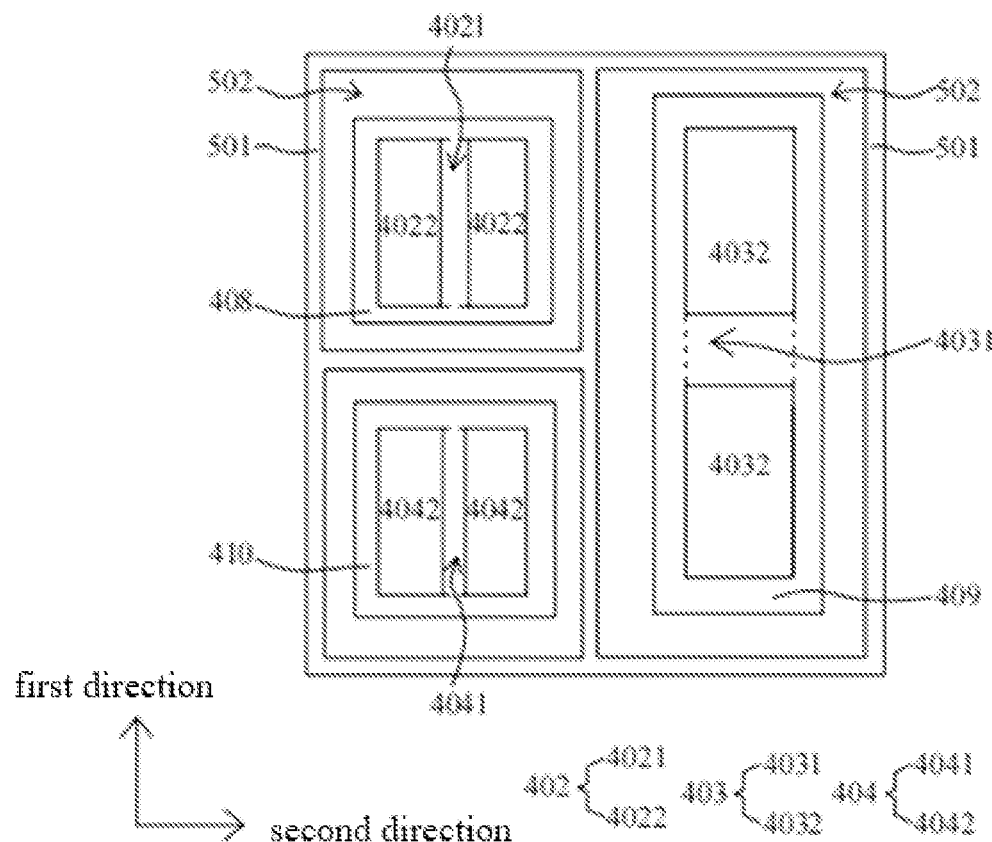
FIG. 13 is a partially enlarged schematic diagram of a display panel according to still another embodiment of the present application.

Please refer to FIG. 13, which is a partially enlarged schematic diagram of a display panel according to still another embodiment of the present application. A display panel of this embodiment is basically similar to the display panel corresponding to FIG. 9, similarities include that a second pixel 403 is provided with at least one blue pixel notch 4031 and at least two blue light emitting portions 4032 arranged along the first direction, and differences includes that a first pixel 402 is provided with at least one green pixel notch 4021 and at least two green light emitting portions 4022 arranged along the second direction, and a third pixel 404 is provided with at least one red pixel notch 4041 and at least two red light emitting portions 4042 arranged along the second direction.

Wherein, the first pixel 402 and the third pixel 404 in this embodiment are respectively the same as the first pixel 402 and the third pixel 404 in FIG. 12, the second pixel 403 in this embodiment is the same as the second pixel 403 in FIG. 9, it is not repeated here.

In the embodiment of the present application, when the first pixel, the second pixel, and the third pixel emit lights of different colors, a maximum size of the second pixel in the first direction is larger than maximum sizes of the first pixel and the third pixel in the first direction, and maximum sizes of the first pixel and the third pixel in the second direction is greater than a maximum size of the second pixel in the second direction, the first pixel is provided with the at least one green pixel notch and at least two green light emitting portions arranged along the second direction, the second pixel is provided with the at least one blue pixel notch and at least two blue light emitting portions arranged along the first direction, and the third pixel is provided with at least one red pixel notch and at least two red light emitting portions arranged along the second direction, each of the at least one green pixel notch is disposed in at least a part of an area between two adjacent green light emitting portions in the second direction, each of the at least one blue pixel notch is disposed in at least a part of an area between two adjacent blue light emitting portions in the first direction, each of the at least one red pixel notch is disposed in at least a part an area between two adjacent red light emitting portions in the second direction, so as to reduce observable angles at which the green light emitted by first pixel and the red light emitted by the third pixel deviate from the frontal viewing angle in the second direction, and to reduce an observable angle the blue light emitted by first pixel deviates from the frontal viewing angle in the first direction, which is beneficial for the observable angles at which the green light emitted by first pixel and the red light emitted by the third pixel deviate from the frontal viewing angle in the second direction and the observable angle at which the blue light emitted by the second pixel deviates from the frontal viewing angle in the second direction to tend to be same, and is beneficial for the observable angle at which the blue light emitted by the second pixel deviates from the frontal viewing angle in the first direction and the observable angles at which the green light emitted by the first pixel and the red light emitted by the third pixel deviate from the frontal viewing angle in the first direction to tend to be same, thereby improving problems that the display panel appears yellowish in the second direction and appears bluish in the first direction.

The descriptions of the above-mentioned embodiments are only used to help understand the technical solutions and core ideas of the present application. Those of ordinary skill in the art should understand that they can still modify the technical solutions described in the foregoing embodiments, or equivalently replace some of the technical features; and these modifications or replacements do not cause the essence of the corresponding technical solutions to deviate from the scope of the technical solutions of the embodiments of the present application.

What is claimed is:

1. A display panel, comprising a plurality of pixel units, wherein one of the pixel units comprises:
   a first pixel; and
   a second pixel, wherein the second pixel and the first pixel emit lights with different colors, the second pixel and the first pixel are disposed at intervals, a maximum size of the second pixel in a first direction is greater than a maximum size of the first pixel in the first direction; the second pixel is provided with at least one pixel notch and at least two light emitting portions arranged along the first direction, each of the at least one pixel notch is disposed in at least a part of an area between two adjacent light emitting portions in the first direction;
   wherein in the first direction, at least two adjacent light emitting portions are spaced apart by one of the pixel notch,
   the second pixel comprises two light emitting portions and one pixel notch therebetween in the first direction, and
   a ratio of a maximum distance between the two light emitting portions in the first direction to a maximum size of one of the light emitting portions in the first direction is greater than or equal to 0.2 and less than or equal to 1.

2. The display panel of claim 1, wherein the first pixel is a green pixel, the second pixel is a blue pixel, the second pixel and the first pixel are disposed at intervals in a second direction, and the second direction intersects with the first direction; and
   wherein one of the pixel units further comprises a third pixel, the third pixel is a red pixel, and the third pixel and the first pixel are disposed side by side along the first direction.

3. The display panel of claim 2, wherein a shape of the first pixel is a rectangle or a near-rectangle, a shape of each of the two light emitting portions is a rectangle or a near-rectangle, and a shape of the third pixel is a rectangle or a near-rectangle.

4. The display panel of claim 2, wherein the first direction is perpendicular to the second direction;
   wherein a ratio of a maximum size of the first pixel in the second direction to the maximum size of the first pixel in the first direction is a first ratio;
   wherein a ratio of a maximum size of each of the light emitting portions in the second direction to a maximum size of each of the light emitting portions in the first direction is a second ratio; and
   wherein a ratio of the first ratio to the second ratio is greater than or equal to 1 and less than or equal to 1.8.

5. The display panel of claim 4, wherein a ratio of a maximum size of the third pixel in the second direction to a maximum size of the third pixel in the first direction is a third ratio; and
   wherein the maximum size of the third pixel in the second direction is equal to the maximum size of the first pixel in the second direction, and a ratio of the first ratio to the third ratio is greater than or equal to 0.6 and less than or equal to 1.

6. The display panel of claim 2, wherein a light emitting area of the second pixel is greater than a light emitting area of the first pixel and a light emitting area of the third pixel.

7. The display panel of claim 2, wherein a ratio of the maximum size of the second pixel in the first direction to the maximum size of the first pixel in the first direction is greater than or equal to 1.2 and less than or equal to 4.

8. The display panel of claim 2, wherein the first direction is perpendicular to the second direction, and the plurality of pixel units are arranged in an array along the first direction and the second direction;
   wherein in the first direction, two second pixels respectively disposed in two adjacent ones of the pixel units are disposed side by side, and the first pixel and the third pixel respectively disposed in two adjacent ones of the pixel units are adjacent to each other and disposed side by side; and
   wherein in the second direction, first pixels and third pixels disposed side by side in the first direction are disposed alternately with second pixels.

9. The display panel of claim 1, wherein the display panel further comprises at least two anodes being disconnected, and the at least two light emitting portions are disposed on the at least two anodes in a one-to-one correspondence.

10. The display panel of claim 1, wherein the display panel further comprises a common anode, and the at least two light emitting portions are disposed on the common anode.

11. The display panel of claim 1, wherein the at least two light emitting portions are driven by a same pixel circuit.

12. The display panel of claim 1, wherein the display panel further comprises:
    a pixel definition layer is provided with a dam and a plurality of pixel definition openings; wherein a periphery of each of the pixel definition openings is provided with the dam, a position of the at least one pixel notch is provided with the dam, and the at least two light emitting portions are disposed in at least one of the pixel definition openings.

13. The display panel of claim 1, wherein the display panel further comprises:
    a light-shielding structure disposed at a light-emitting side of the plurality of pixel units, the light-shielding structure is provided with a plurality of openings; the first pixel overlaps with a corresponding one of the openings, and the second pixel overlaps with a corresponding one of the opening.

14. The display panel of claim 1, wherein a minimum size of the second pixel in the first direction is greater than the maximum size of the first pixel in the first direction.

15. A display panel, comprising a plurality of pixel units, wherein one of the pixel units comprises:
- a first pixel, a second pixel, and a third pixel,
  wherein the first pixel is a green pixel, the second pixel is a blue pixel, the third pixel is a red pixel,
- the third pixel and the first pixel are disposed side by side along a first direction, and the second pixel and the first pixel are disposed at intervals in a second direction, wherein the first direction is perpendicular to the second direction;
- a maximum size of the second pixel in a first direction is greater than a maximum size of the first pixel in the first direction, the second pixel is provided with at least one pixel notch and at least two light emitting portions arranged along the first direction, each of the at least one pixel notch is disposed in at least a part of an area between two adjacent light emitting portions in the first direction;
- in the first direction, at least two adjacent light emitting portions are spaced apart by one of the pixel notch, and the second pixel comprises two light emitting portions and one pixel notch therebetween in the first direction;
- a ratio of a maximum size of the first pixel in the second direction to the maximum size of the first pixel in the first direction is a first ratio,
- a ratio of a maximum size of each of the light emitting portions in the second direction to a maximum size of each of the light emitting portions in the first direction is a second ratio, and
- a ratio of the first ratio to the second ratio is greater than or equal to 1 and less than or equal to 1.8.

16. The display panel of claim 15, wherein a ratio of a maximum size of the third pixel in the second direction to a maximum size of the third pixel in the first direction is a third ratio; and
- wherein the maximum size of the third pixel in the second direction is equal to the maximum size of the first pixel in the second direction, and a ratio of the first ratio to the third ratio is greater than or equal to 0.6 and less than or equal to 1.

* * * * *